United States Patent [19]
Davies et al.

[11] Patent Number: 4,485,352
[45] Date of Patent: Nov. 27, 1984

[54] CURRENT AMPLIFIER

[75] Inventors: Robert B. Davies, Tempe; Robert N. Dotson; Michael W. Null, both of Mesa, all of Ariz.

[73] Assignee: Motorola, Inc., Schaumburg, Ill.

[21] Appl. No.: 413,052

[22] Filed: Aug. 30, 1982

[51] Int. Cl.³ .......... H03F 3/04
[52] U.S. Cl. .......... 330/288
[58] Field of Search .......... 330/257, 288, 296; 323/315, 316

[56] References Cited

U.S. PATENT DOCUMENTS 4,260,955 4/1981 Ahmed .......... 330/288

*Primary Examiner*—James B. Mullins
*Assistant Examiner*—G. Wan
*Attorney, Agent, or Firm*—Joe E. Barbee

[57] ABSTRACT

A current amplifier uses a current mirror arrangement as an operational amplifier whose output has limited swing. The limited swing is achieved through a plurality of series connected diodes connected to a control input of the amplifier and to the output of the operational amplifier. The control input is coupled through a transistor to inhibit the output of the current mirror arrangement. The output node is coupled to an output for the current amplifier through a Darlington arrangement which provides high current gain.

6 Claims, 1 Drawing Figure

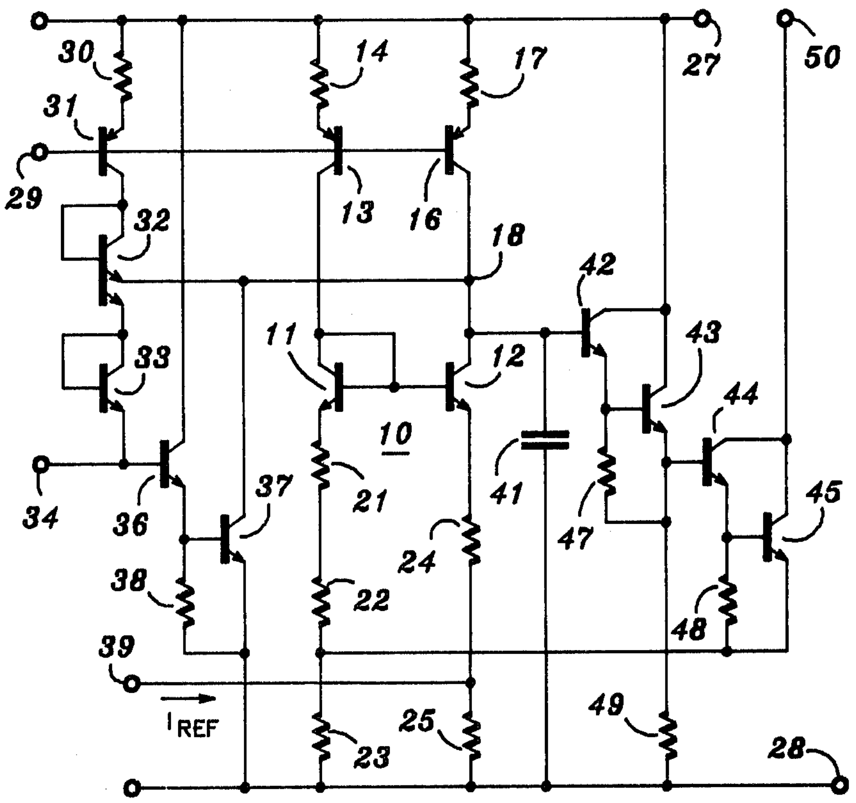
30
31
29
32
33
34
36
37
38
39
IREF
14
13
17
16
18
11
12
10
21
22
23
24
25
41
42
43
44
45
47
48
49
27
50
28

CURRENT AMPLIFIER

This invention relates, in general, to current amplifiers, and more particularly, to a fast response current amplifier having high current output capability.

Current amplifiers are well known and are frequently used in electronic systems. However, many of such current amplifiers suffer from one or more shortcomings such as having wide voltage swings thus being slower in response, not being critically damped, or not providing a sufficient output current capability.

Accordingly, it is an object of the present invention to provide an improved current amplifier having high current gain.

Another object of the present invention is to provide a current amplifier which has a limited amount of swing on an output node which increases speed without loss of phase.

Yet a further object of the present invention is to provide a current amplifier which is fast in response time while remaining critically damped.

SUMMARY OF THE INVENTION

The above and other objects and advantages of the present invention are provided by using a current mirror arrangement as an amplifier receiving inputs at the emitters of the current mirror. A plurality of series connected diodes are coupled to an output node of the current mirror arrangement and to a control input. The control input is coupled to the output node also. The series connected diodes serve to limit the swing at the output node of the current mirror amplifier. The output node drives a Darlington arrangement to provide a high current output for the current amplifier.

BRIEF DESCRIPTION OF THE DRAWING

The single FIGURE illustrates in schematic form an embodiment of the present invention.

DETAILED DESCRIPTION OF THE DRAWING

The single FIGURE illustrates in schematic form a current amplifier having a current mirror arrangement 10 serving as an amplifier. Current mirror arrangement 10 has a transistor 11 and a transistor 12 with their bases connected together. The emitter of transistor 12 is coupled to a voltage terminal 28 by series connected resistors 24 and 25. The emitter of transistor 11 is connected to voltage terminal 28 by series connected resistors 21, 22, and 23. The base electrodes of transistors 11 and 12 are connected to the collector of transistor 11. The collector of transistor 11 is also connected to the collector of transistor 13 which has an emitter coupled to voltage terminal 27 by resistor 14. The collector of transistor 12 is connected to the collector of transistor 16 which also has an emitter which is coupled to voltage terminal 28 by a resistor 17. Voltage terminals 27 and 28 serve as the power supply terminals wherein terminal 27 is at a more positive voltage than terminal 28. In a preferred embodiment, voltage terminal 28 will be at ground potential. The collectors of transistors 12 and 16 form an output node 18 which serves as an output node for the current mirror amplifier arrangement.

An input to the amplifier arrangement is applied on line 39 to the junction of resistors 24 and 25. This input is a reference current ($I_{REF}$) for the current mirror amplifier. A second input appears at the junction between resistors 22 and 23, and if current mirror amplifier 10 is considered as an operational amplifier, the input to resistor 25 would be the non-inverting input and the input to resistor 23 would be the inverting input which in the preferred embodiment receives a feedback signal from the current amplifier output. Transistor 13 and resistor 14 serve as a current source for transistor 11, and transistor 16 and resistor 17 serve as a current source for transistor 12.

A control input is received at input 34 which is connected to an emitter of transistor 33. Transistor 33 is a diode connected transistor by having its base connected to its collector which is also connected to an emitter of transistor 32. Transistor 32 has two emitters, the second emitter is connected to output node 18. The base electrode of transistor 32 is connected to its collector which is also connected to the collector of transistor 31. Transistor 31 has its emitter connected to voltage terminal 27 through resistor 30. The base electrode of transistor 31 is connected in common with the base of transistors 13 and 16 to line 29 which serves as the bias input for the current sources formed by these transistors. In other words, transistor 31 and resistor 30 form a current source for diode connected transistors 32 and 33. Control input 34 is also connected to the base electrode of transistor 36 which has its collector connected to voltage terminal 27. The emitter of transistor 36 is connected to the base electrode of transistor 37 and to a resistor 38. Transistor 37 has its collector connected to output node 18, and its emitter is connected to voltage terminal 28. Resistor 38 is connected between the base electrode of transistor 37 and voltage terminal 28. Transistors 36 and 37 serve as coupling means for the control input signal appearing at line 34. Resistor 38 is a bleed off resistor to insure that transistor 37 turns off faster when an enabling input is removed from input 34.

Output node 18 is coupled to voltage terminal 28 by capacitor 41 which serves as loop compensation for the current amplifier. Output node 18 is also connected to the base of transistor 42 which has a collector which is connected to voltage terminal 27. The emitter of transistor 42 is connected to the base of transistor 43 which has its collector connected to the collector of transistor 42. The emitter of transistor 43 is coupled to voltage terminal 28 by resistor 49. Transistors 42 and 43 serve as a Darlington arrangement and have a bleed off resistor 47 connected from the base of transistor 43 to the emitter of transistor 43. The emitter of transistor 43 is also connected to the base of transistor 44 which has an emitter connected to the base of transistor 45. Bleed off resistor 48 is connected from the base of transistor 45 to the emitter of transistor 45. The collectors of transistors 44 and 45 are connected together to output terminal 50. The emitter of transistor 45 is also connected to the inverting input of the current mirror arrangement 10, which input is the junction between resistors 22 and 23. This serves as feedback for the current amplifier. Transistors 44 and 45 also form a Darlington arrangement and resistors 47, 48 and 49 are used as bleed off resistors to allow the high current gain Darlington arrangement to shut off or cease conduction faster.

The control input at input 34 only has to be two diode drops or 2 $V_{BE}$ (base to emitter voltage) drops above ground in order to enable transistor 36 which in turn enables transistors 37. When transistor 37 is enabled, output nose 18 is pulled down to a level which is just 3 $V_{BE}$ drops above ground. When output node 18 is clamped to this level, transistors 42 and 43 will remain enabled; however, transistors 44 and 45 will not be enabled and therefore Darlington arrangement 44 and 45 cannot sink any current from output terminal 50. When the control input at input 34 goes below 2 $V_{BE}$ voltage drops then transistors 36 and 37 will not be enabled and node 18 will rise to a voltage level equal to 4 $V_{BE}$ plus the voltage developed across resistor 25 due to the reference current at input 39. When output node 18 rises to this level then transistors 44 and 45 are enabled and output terminals 50 can sink current. The arrangement of series connected diodes 32 and 33 plus input coupling transistors 36 and 37 insure that output node 18 has a limited swing. It should also be noted that the anode of a diode can be connected to the collector of transistor 13 and the cathode of the diode can be connected to a series of switchable diodes which can be switched in conjunction with the control input at input 34. This would clamp the collector of transistor 11 between two voltage levels to prevent transistor 12 from going into saturation.

In a preferred embodiment, the total resistance of resistors 21, 22, and 23 will equal the total resistance of resistors 24 and 25. Resistors 21 and 22 are illustrated as being two different resistors because of the preferred manner in obtaining these resistance values in a fully integrated circuit. Resistors 21 and 24 will be of a much larger value than resistors 22, 23, and 25. As an example, resistors 21 and 24 can be one thousand ohms whereas resistor 25 can be seventy-five ohms and resistor 22 will then be seventy-two ohms and resistor 23 will be three ohms. In a preferred embodiment, resistors 21 and 24 are P material resistors while resistors 22, 23, and 25 are N+ material resistors. The current sinking capability developed at output terminal 50 will be the ratio of resistor 25 to resistor 23 times the current reference ($I_{REF}$) provided at input 39.

The current amplifier illustrated in the single FIGURE is well suited for use in a magnetic bubble memory operational driver for driving coils. In such an application the voltage applied to voltage terminal 27 could be 5 volts, the voltage terminal 28 would be ground, and output terminal 50 could be coupled to a 12 volt power supply through a coil. In a magnetic bubble memory circuit it is necessary that the trailing edge of the output current decrease gradually to prevent the generation of double bubbles. An output signal from a ramp generator can be applied to output node 18. This is accomplished by having a collector of a transistor connected to output node 18, the emitter of the transistor connected to voltage terminal 28, and the base electrode of the transistor receiving the ramp generator output. In such an application the control input signal at input 34 can be used to enable output 50 while the output of the ramp generator can be used to turn off the output at output 50.

By now it should be appreciated that there has been provided a current amplifier which has a limited amount of swing on an output node thereby increasing speed without loss of phase. The current amplifier provides a high output current capability, has fast response, and yet remains critically damped.

We claim:

1. A current amplifier for providing a high current output comprising: a current mirror having an output; current source means coupled to the current mirror for providing current to the current mirror; control means coupled between an input of the current amplifier and the output of the current mirror for inhibiting the output upon command of an control signal; and a Darlington arrangement coupled to and driven by the output of the current mirror for providing a high current output.

2. The current amplifier of claim 1 wherein the current mirror has two transistors, and emitters of the two transistors serve as inputs to an amplifier formed by the current mirror and the current source means.

3. The current amplifier of claim 2 wherein the current source means has two current sources, one coupled to each of the two transistors.

4. A current amplifier having a current mirror; first means for providing current to the current mirror; control means for coupling a control input to an output of the current mirror amplifier to controllably inhibit the output; and high current means coupled to and driven by the output of the current amplifier for providing an output, a portion of which is coupled to an input of the current mirror amplifier.

5. The current amplifier to an input signal of claim 4 further havingg means to clamp the output of the current mirror amplifier to a predetermined level to limit voltage swing thereby providing faster response of the current amplifier.

6. A fast response current amplifier having a first and a second voltage terminal, a reference input, and a control input, comprising: a first and a second transistor connected in a current mirror configuration and having emitters resistively coupled to the second voltage terminal; first and second current sources coupled between current carrying electrodes of the first and second transistors and the first voltage terminal; a plurality of diodes connected in series between the first voltage terminal and the control input; an input transistor having its base coupled to the control input, its emitter coupled to the second voltage terminal, and its collector coupled to the plurality of diodes and to an output node formed by the second transistor and the second current source; and a Darlington arrangement coupled between the output node and an output of the current amplifier.

* * * * *

UNITED STATES PATENT AND TRADEMARK OFFICE

CERTIFICATE OF CORRECTION

PATENT NO. : 4,485,352

DATED : Nov. 27, 1984

INVENTOR(S) : Robert B. Davies et al.

It is certified that error appears in the above-identified patent and that said Letters Patent is hereby corrected as shown below:

Column 4, line 32, delete "to an input signal".

Column 4, line 33, change "havingg" to --having--.

Column 4, line 36, after "amplifier", add --to an input signal--.

Signed and Sealed this

*Twenty-third* Day of *April 1985*

[SEAL]

*Attest:*

DONALD J. QUIGG

*Attesting Officer* *Acting Commissioner of Patents and Trademarks*